United States Patent [19]
Brown

[11] 4,086,656
[45] Apr. 25, 1978

[54] ANALOG-TO-DIGITAL INTEGRATING APPARATUS WITH PULSE DENSITY CONVERSION PRIOR TO ACCUMULATION

[75] Inventor: James L. Brown, Toddville, Iowa

[73] Assignee: Rockwell International Corporation, El Segundo, Calif.

[21] Appl. No.: 734,689

[22] Filed: Oct. 21, 1976

[51] Int. Cl.² .................... G06G 7/18; H03K 13/20
[52] U.S. Cl. .................... 364/733; 340/347 M; 340/347 NT
[58] Field of Search .... 340/347 M, 347 NT, 347 AD; 324/99 D; 364/733

[56] References Cited
U.S. PATENT DOCUMENTS

| B 288,627 | 1/1975 | Cuzzo | 340/347 NT X |
| 3,757,261 | 9/1973 | Sather | 235/150.31 |
| 4,006,475 | 2/1977 | Candy | 340/347 DA |

*Primary Examiner*—Thomas J. Sloyan
*Attorney, Agent, or Firm*—Richard A. Bachand; H. Fredrick Hamann

[57] ABSTRACT

An analog-to-digital integrator utilizing a voltage to pulse frequency converter which has an analog integrator that charges and upon exceeding predetermined thresholds provides an output pulse and simultaneously discharges the integrator for a predetermined time. The output pulse also actuates a serial adder which sums a scale word with the previous accumulated result; this accumulated result is the digital word output of the integrator.

2 Claims, 5 Drawing Figures

ANALOG-TO-DIGITAL INTEGRATING APPARATUS WITH PULSE DENSITY CONVERSION PRIOR TO ACCUMULATION

THE INVENTION

The present invention is generally related to electronics and more specifically related to electronic integrators.

Although it is realized there are many different types of analog-to-digital integrators, it is believed that the pulse density conversion before digital accumulation is a simple approach not previously thought of.

It is, therefore, an object of the present invention to provide an improved analog-to-digital integrator which is accurate over a wide temperature range.

Other objects and advantages of the present invention will be ascertained from a reading of the specification and appended claims in conjunction with the drawings wherein:

FIG. 1 is a block diagram of the inventive concept;
FIG. 2 is a detailed block diagram of FIG. 1;
FIG. 3 is a series of waveforms for use in explaining the operation of FIGS. 1 and 2;
FIG. 4 is a detailed block diagram of FIG. 1 using a high accuracy voltage/frequency converter; and
FIG. 5 is a series of waveforms developed in the operation of the circuit of FIG. 4.

DETAILED DESCRIPTION

Figure 1:
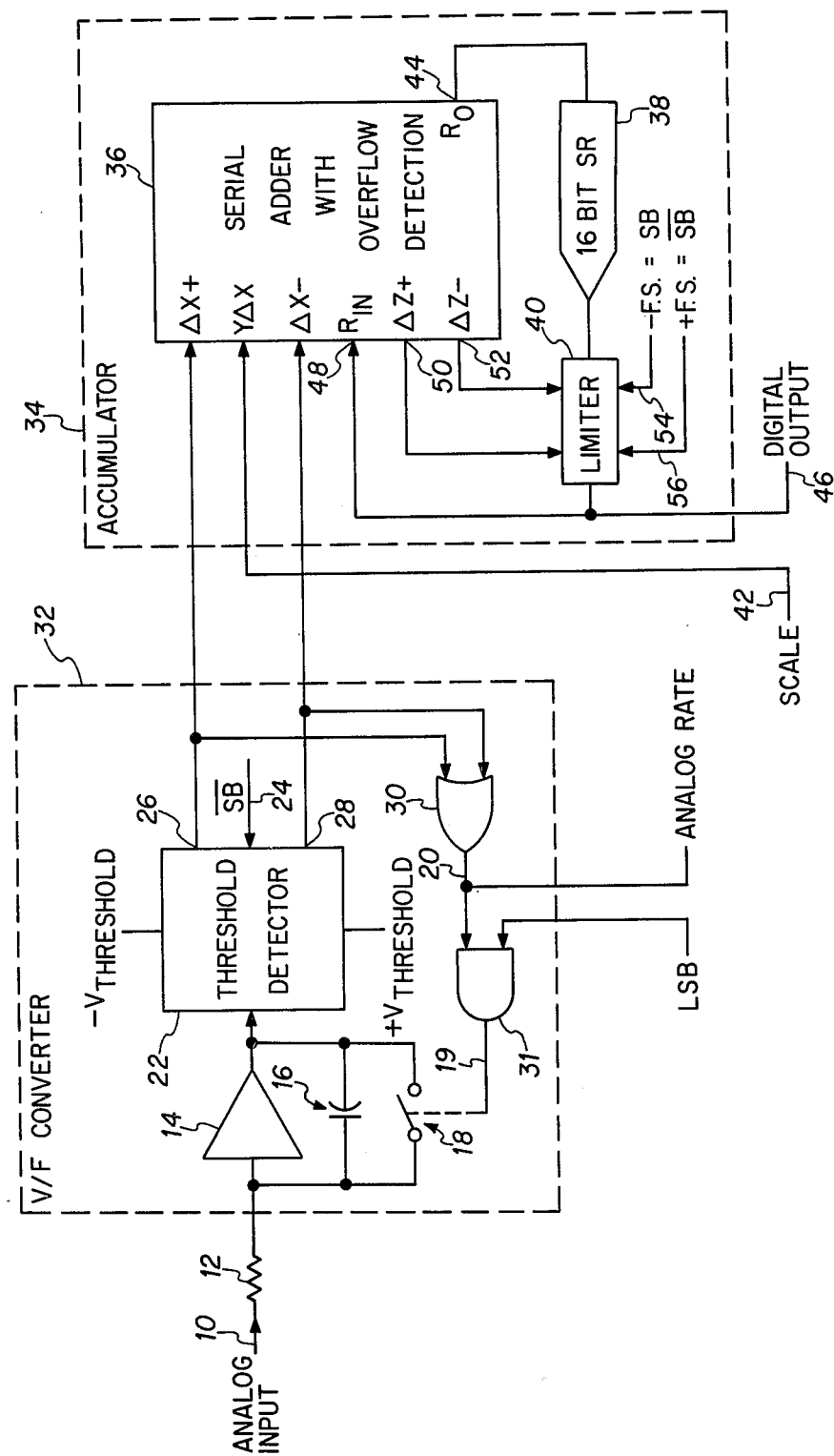

In FIG. 1, an analog input signal is applied to a terminal 10 and through a resistor 12 to the input of an operational amplifier 14 used in conjunction with a capacitor 16 to provide an integrating means. A switch generally designated as 18 is connected in parallel with capacitor 16 and is actuated by a signal from a lead 19. An output of amplifier 14 is supplied to a block 22, labeled threshold detector, having equal positive and negative threshold reference voltages provided as inputs. A synchronizing input 24 supplies clock signals to the threshold detector so that it operates synchronously with the rest of the circuitry and the detector has outputs 26 and 28 which provide pulses whenever the threshold of device 22 is exceeded. An output is provided on 28 whenever the positive threshold is exceeded and an output is provided on 26 when a negative threshold is exceeded. The two outputs on 26 and 28 are supplied to an OR gate 30 which has its output connected to analog rate lead 20. The analog rate signal on the lead 20 and a least significant bit (LSB) signal of one data bit wide and occuring after sync bit are ANDed in a gate 31 to provide the drive on lead 19 to switch 18. The use of LSB with analog rate is to minimize the switch reset time. With a 500kHz clock rate (2μSec/bit) and assuming stability of capacitor 16, amplifier 14 and resistor 12 the accuracy will be:

(pulses/second)(34 × 10⁻⁶) (1/100)%

This error is 1 word (16 bits) over integration (amplifier 14 output exceeding $+V_{threshold}$ or $-V_{threshold}$ just before sync 24) plus one bit wide reset on 19 to switch 18 during which time no integration can take place. All the apparatus described so far is contained within a dashed line block 32 which is labeled V/F converter (voltage-to-frequency converter). As mentioned, the entire apparatus of FIG. 1 is synchronized and the device operates in the embodiment shown with serial digital words. The output pulses on 26 and 28 are each maintained for one word time and an output on lead 26 indicates that the analog input signal 10 is positive and the amplifier 14 output is more negative than $-V_{threshold}$ while an output on 28 indicates that the input 10 is negative and the amplifier 14 output is more positive than $+V_{threshold}$.

The signals on leads 26 and 28 are also supplied to an accumulator block 34 containing a serial adder 36, a 16-bit shift register 38, and a limiter 40. The adder 36 is more commonly described as an R adder and has overflow detection. More information on the operation of such a serial adder may be obtained from my co-pending application Ser. No. 715,775, filed August 19, 1976, or from U.S. patent No. 3,757,261, both of which are assigned to the same assignee as the present invention. As illustrated, the leads 26 and 28 are connected to the ΔX+ and ΔX− inputs of adder 36 which has a further lead 42 designated as scale connected to a YΔX input. An R₀ output 44 is connected to an input shift register 38 whose output is connected to an input of limiter 40. An output of limiter 40 is connected to a digital output lead 46 as well as to an $R_{in}$ input 48 of adder 36. Positive and negative overflow outputs 50 and 52, respectively, of adder 36 supply signals to limiter 40. Limiter 40 also receives signals on leads 54 and 56 indicative, respectively, of sign bit (SB = −Full Scale) or sign bit not (SB = +Full Scale) for the purpose of indicating negative full scale or positive full scale conditions at the integration output 46. Sign bit and sync bit occur at the same time and may be used interchangeably and is equal to minus full scale in a 2's complement data system.

Figure 2:
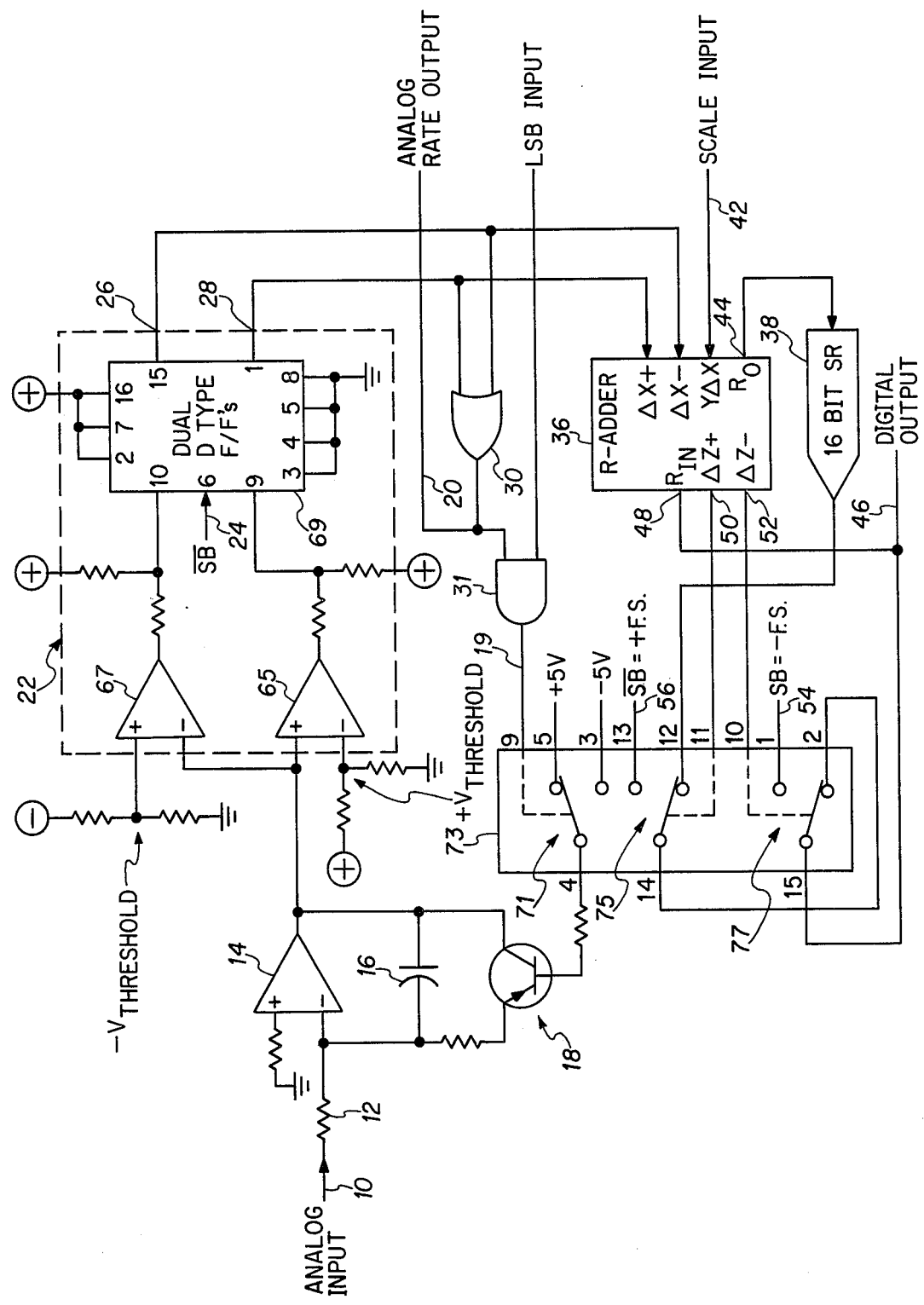

In FIG. 2, the same numbers as used in FIG. 1, are provided for the identical items. As will be noted, however, additional numbers are used where the items are not identical or are added. An output of amplifier 14 is connected to a positive or non-inverting input of amplifier 65 as well as to the inverting input of amplifier 67. Each of these amplifiers are connected as shown to a block 69 containing two D-type flip-flops. The terminal numbers illustrated are those used in one-half of a CD-4035 package available from RCA and others. The circuit in the 4035 package is called a shift register but comprises 4 D-type flip-flops and it is the flip-flop function being used with the pin numbers indicated. The output 20 of OR gate 30 when ANDed with LSB by gate 31 provides a signal on 19 which operates a switch generally designated as 71 within a package 73 which may be a portion of a device CD-4053 (under the title "multiplexer") also obtainable from the same manufacturer as listed above. The output of shift register 38 is supplied to a switch generally designated as 75 and controlled by output 50 of adder 36. Finally, a switch generally designated as 77 is operated by output 52 of R adder 36 and connects the output of switch 75 to digital output 46. The positions alternate to that shown are the conditions of overflow of the adder and at this time the switches 75 and 77 are connected to receive signals from either the SB (minus full-scale) or SB (plus full-scale) leads 54 and 56, respectively.

Figure 3:
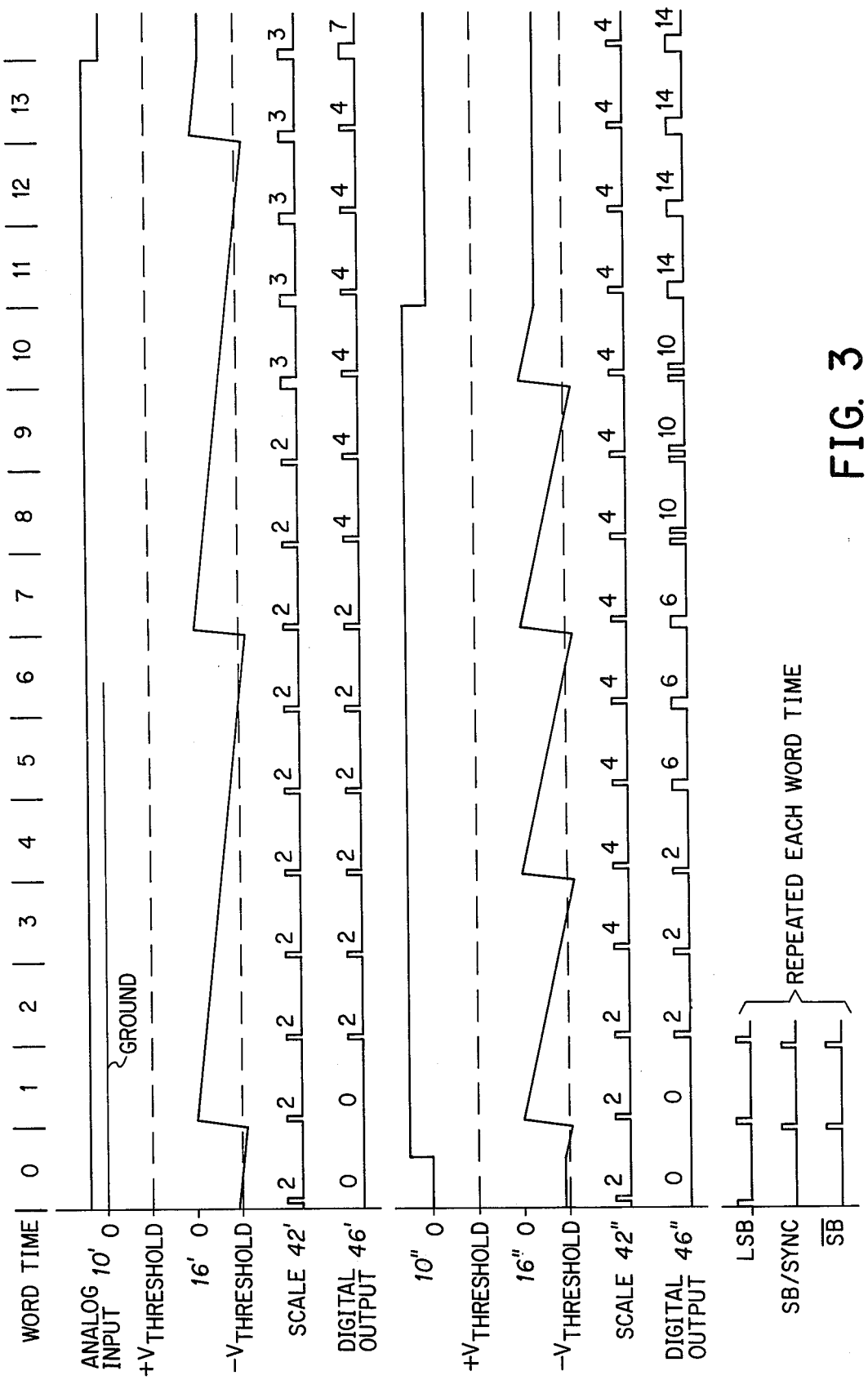

In FIG. 3, waveforms are given the same numerical designation as provided in FIG. 1 with a prime indicating a first set of conditions and a double prime indicating a second set of conditions. It will be noted, however, that in addition to using the binary serial digital words as used in an actual embodiment of the invention, a base 10 number system has been used for ease of illustration for each of the word times as the numbers which would appear on leads 42 and 46.

Figure 4:
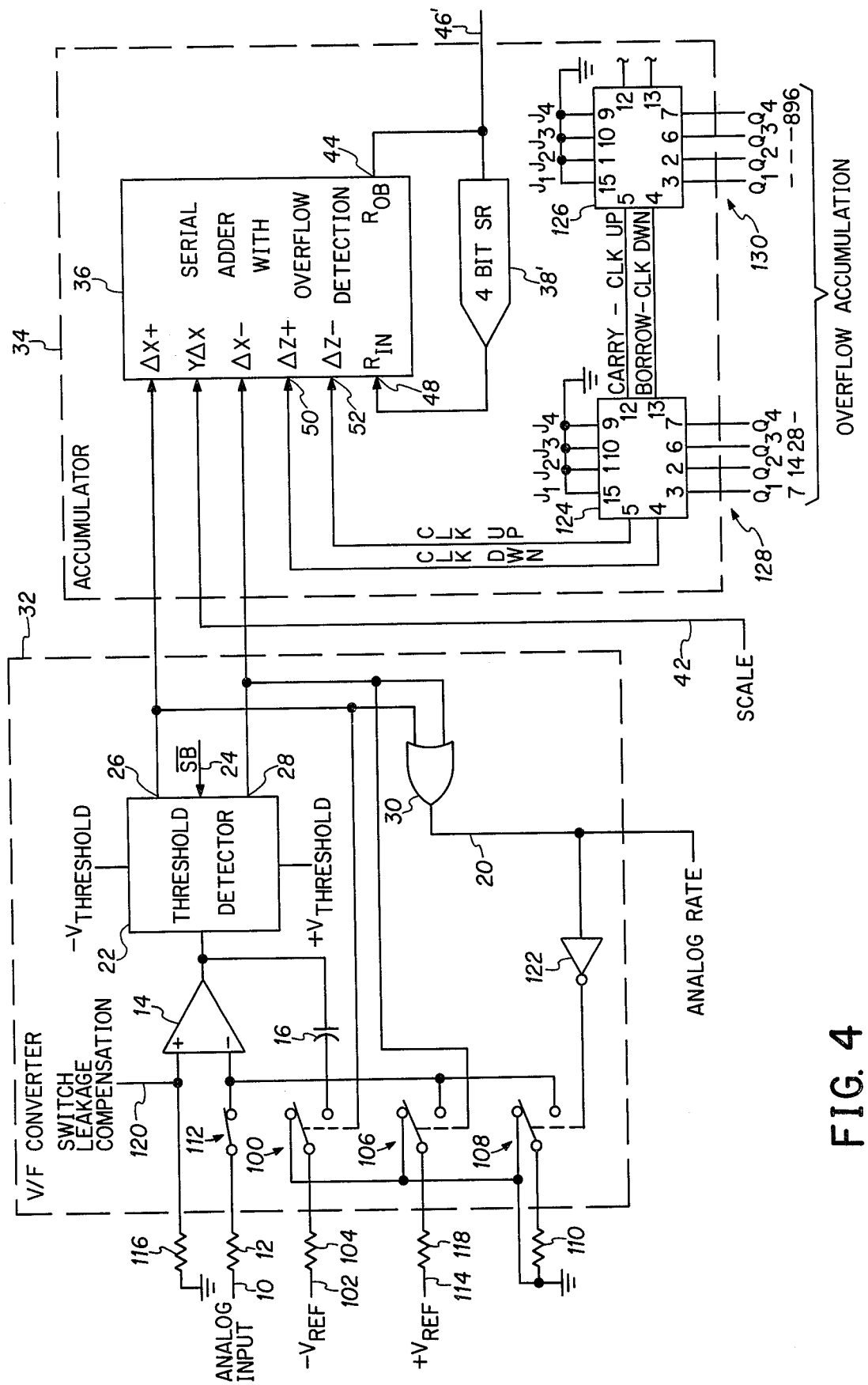

FIG. 4 illustrates a further embodiment of FIG. 1 which has added features to make it more accurate in MOS circuitry and to increase the output word capacity. Like designation numbers have been used for like parts as compared to FIG. 1 with the new parts either having a prime or new numbers.

The amplifier 14 is illustrated as having additional circuitry connected to the negative input. A $-V_{reference}$ 102 is connected through a resistor 104 and a switch 100 to the negative input. A further voltage reference $+V_{reference}$ 114 is connected through a resistor 118 and a switch 106 to this same negative or inverting input of amplifier 14. Finally, ground or reference potential is connected through a resistor 110 and a switch 108 to the inverting input of amplifier 14. The positive input of amplifier 14 is connected through a resistor 116 to ground or reference potential and is also connected to structural components on the MOS chip to provide switch leakage compensation illustrated by a lead 120 which will compensate for the leakage in switches connected to the inverting input of amplifier 14. If the switches thus mentioned were true and ideal switches (instead of FET's), no such leakage compensation would be required. As will be additionally noted, a switch 112 is connected between resistor 12 and the negative input of amplifier 14. An inverter 122 is used between analog rate lead 20 and switch 108 for controlling same. The leads 26 and 28 are connected to control switches 100 and 106, respectively. Thus, capacitor 16 is discharged or reduced in charge by signals flowing from sources 102 and 114 rather than being discharged through a parallel switch shown as 18 in FIG. 1.

Within the accumulator 34, the shift register 38' is reduced to four bits of capacity. This requires that the entire circuit of FIG. 4 use four-bit words rather than the sixteen-bit words previously used in FIG. 1. The four-bit register is used merely to illustrate in FIG. 5 the action of the overflow accumulator section of accumulator 34. As illustrated, a pair of blocks 124 and 126 are used to provide overflow accumulation. In one embodiment of this invention, these blocks were acquired under Part Number CD-40193 from RCA. Only two such units are shown, but more may be added for further accumulation capability. Design planning must be used to make sure that the overflow output capability exceeds the maximum integration that will ever occur in the application of the invention. The pin numbers on these blocks are illustrated and the output leads numbered $Q_1$ through $Q_4$ of block 124 are generally indicated as 128. The similar outputs of block 126 are generally indicated as 130. The lead $Q_1$ of leads 128 is indicative of the binary bit 7 for positive numbers or 8 for negative numbers while $Q_2$ is indicative of binary bit 14 for positive numbers or 16 for negative numbers.

OPERATION

In operation, a positive input signal is supplied on 10 to amplifier 14 and increases the potential across capacitor 16. At some point in time, such as during word time 0, the output of amplifier 14 exceeds the negative threshold level of detector 22 and this causes an output during the transition between word time 0 and word time 1 on lead 26 (signal not shown). This output is passed through OR gate 30 and ANDed with LSB to close switch 18 and discharge capacitor 16, as illustrated in FIG. 3. The signal on lead 26 also actuates the $\Delta X+$ input of adder 36 so as to add a digital number (2) appearing on scale lead 42 to the number appearing at the output of limiter 40 and supplied to adder 36 at input 48. It may be assumed that under the initial conditions, a digital 0 is contained in shift register 38 and passes through limiter 40 to appear at input 48 of adder 36. Since adder 36 in the embodiment illustrated is a serial type adder, the addition will take place one bit at a time and each resultant sum bit is passed from output 44 into shift register 38. At the commencement of word time 2, this output word will appear at digital output lead 46 and again be returned to adder 36. However, since there are no outputs on either of leads 26 or 28, the scale word will be neither added to or substracted from the $R_{in}$ word and therefore the contents of shift register 38 will merely be circulated through adder 36 and back into register 38. The output 46 will remain a digital 2 using the numbers illustrated until the threshold is again exceeded in word time 6. Then, during word time 7, an output pulse is provided and the circulating word or resultant is increased to 4 which appears at the output 46 during word time 8.

For the purposes of illustration, the scale digital word on lead 42 is changed at word time 10 such that the pulse 26' (not shown) appearing at word time 13 causes a 3 to be added to the resultant within shift register 38 to produce a 7 at the digital output 46 in word time 14.

From the above, it can be determined that the scale input 42 can be used to alter the rate of analog-to-digital integration of a given input. If the scale number is larger, a given input amplitude on lead 10 will produce a maximum output in a shorter period of time than with a smaller scale number.

Referring to waveform 10", it will be noted that the amplitude of the analog input is increased. Thus, the output of integration amplifier 14 increases at a faster rate and output pulses 26" (not shown) occur more often in response to the passing of the threshold level. Thus, the analog-to-digital integrators' digital output indication increases at a faster rate. As will also be noted, the scale has been changed from 2 to 4 between word times 2 and 3 so as to produce an even faster rate of output change on lead 46. As will be realized, when there is no input, the waveform 16' or 16" will not change in value and thus there will be no more outputs on 26 or 28. Also, if the input signal at 10 is changed to be negative with respect to ground, the positive threshold will eventually be reached and output pulses will appear on lead 28 which will result in discharging capacitor 16 by closing switch 18.

Thus far, no mention has been made of the limiter 40 of FIG. 1. It will be realized that it would be undesirable for an integrator to reach a maximum output and then suddenly revert to zero or to the opposite polarity maximum output. Thus, the overflow outputs 50 and 52 of serial adder 36 act to limit the output when and overflow condition occurs. In limiting the output, the number which appeared at output 44 is replaced by a maximum possible number obtained from inputs 54 or 56 in accordance with the positive or negative overflows 50 and 52, respectively. In other words, if a summation number is obtained within adder 36 which exceeds the output capability of adder 36 in the positive direction, an output will be generated at 50 indicating an overflow condition and the excess over the maximum capability of adder 36 appears on 44. Switches within limiter 40 prevent the passage of this number stored in shift register 38 and instead output the number from lead 56 into input 48 during the next word time. If the threshold of 22 has not been exceeded, this maximum number will merely be added to zero and this summation number will be circulated. Upon the next occurence of a positive threshold being exceeded by the signal on capacitor 16, the scale number will be added to the maximum number, another overflow condition will appear on 50 and again the input from 56 will be output on lead 46 rather than the number stored in shift register 38. When overflow conditions occurs in the negative direction, similar switching will result so that the input from 54 is output rather than the input from shift register 38.

Referring now to FIG. 2, it will be noted that the threshold detector 22 comprises two operational amplifiers 65 and 67 which will provide an output if either the positive or negative threshold is exceeded to the specific inputs of the dual D flip-flop 69. The D flip-flops operate such that the output on either 26 or 28 is actuated at the end of the sign bit since the $\overline{SB}$ input 24 is used and the D flip-flop remains in a logic 1 output condition until the end of that word time at which another input is received on 24.

From the details of switch 73, it will be noted that normally the transistor 18 is biased with a positive voltage on its base and therefore is in an OFF condition. When a logic 1 is obtained from either output 26 or 28, it is passed through OR gate 30 and used to actuate switch 71 and apply a negative bias to transistor 18 and thereby discharge capacitor 16 for predetermined amount of time (one LSB bit time).

The further switches 75 and 77 operate a similar manner such that in the conditions shown in the signal from shift register 38 is passed through the switches and back to input 48 of R adder 36. However, when an overflow output is obtained from either 50 or 52, the switches are actuated to provide the indicated signals to the output 46 rather than the signal obtained from shift register 38.

Figure 5:
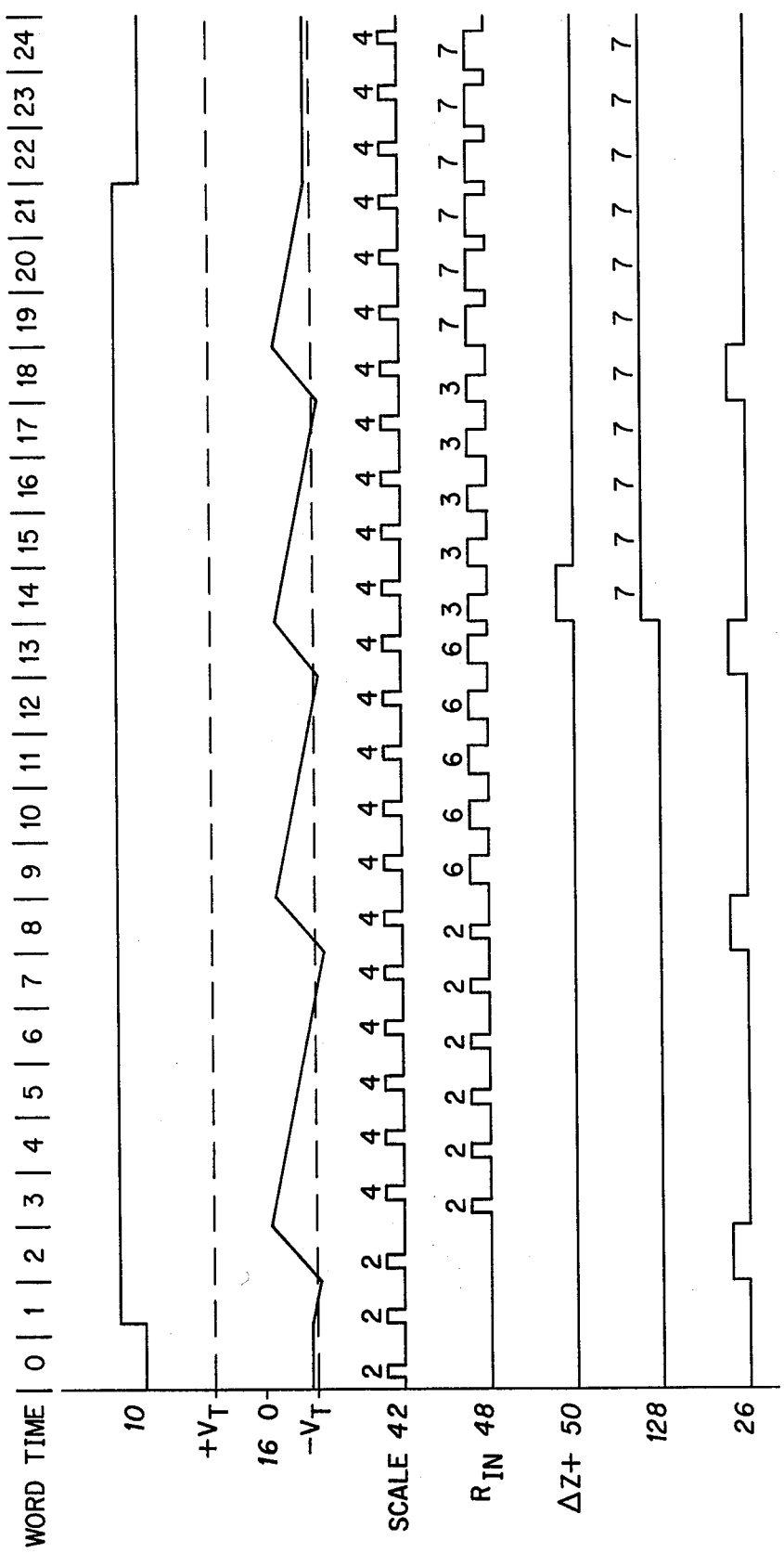

In FIG. 4, the operation of V/F converter 32 is similar to that of FIG. 1 except for the method of feedback to discharge capacitor 16 each time a pulse appears on output 26 or 28. In FIG. 4, a positive analog signal on lead 10 results in the output of amplifier 14 going negative and eventually exceeding $-V_{threshold}$ and causing an output 26 which causes a switch 100 to alternate from the position shown and apply a current from a $-V_{reference}$ 102 through a resistor 104 and the internal resistance of switch 100 to the minus input of amplifier 14. This results in a reduction in the charge on capacitor 16 until the amplifier 14 output is reduced from the $-V_{threshold}$ toward zero. Once the amplifier output returns inside the $-V_{threshold}$ and $+V_{threshold}$ limits, the output on lead 26 will return to zero and switch 100 returns to the position shown. For a negative analog input on lead 10, operation is similar except a switch 106 is operated. A switch 108 is provided with a resistor 110 to maintain the minus input impedance of operational amplifier 14 and switch characteristics the same by complementing the operation of switches 100 or 106 with operation of switch 108. Switch 112 is included in series with resistor 12 such that input 10 has the same electrical (impedance) characteristics as inputs 102, 114, or ground through switch 108 and resistor 110. A resistor 116 is chosen to have a value equal to resistor 12 in parallel with resistor 104, 118 or 110 in accordance with which input is activated. Having equal impedance on both the the plus and minus inputs of amplifier 14 allows common mode rejections of amplifier input bias current. Since switches 100, 106 and 108 are not ideal in that semiconductor devices contain parasitic leakages, a similar junction and operating areas 120 are connected to the plus input of amplifier 14. Therefore, with similar switch leakages being similar in size and characteristic in temperature (as is possible with semiconductor MOS chip fabrication with equal amplifier plus and minus input source impedance) the effect on the output signal of amplifier 14 due to switch leakage currents will be reduced by the input common mode rejection of amplifier 14. Since switch 108 complements the operation 100 or 106, switching transients from the switch drive sources 26, 28 and 122, passing through the switch parasitics, can be minimized by like construction of switches and signal sources. Although the switching in FIG. 4 is more complicated than that of FIG. 1, the residue from integration above, the plus or minus $V_{threshold}$ is retained in capacitor 16 and integration of the signal on input 10 during switching of 100 or 106 continues. The accuracy of the FIG. 4 V/F conversion is primarily dependent on the ratio and tracking of resistors 12, 104 and 118 as well as the input characteristics of amplifier 14. Also, absolute values of $V_{reference}$ 102 and 114 and similarity of switch drive signals to switches 100, 106 and 108 can influence accuracy. The accumulator 34 of FIG. 4 does not have the limiter 40 of FIG. 1 but instead uses an overflow accumulator register comprising 124 and 126. The shift register 38' is shown reduced to four-bits of capacity such that the appropriate waveforms of FIG. 3 can be reiterated in FIG. 5 to show overflow operation into the overflow accumulator blocks 124 and 126. The total digital answer is the sum of register 38' added to the end of the word obtained from leads 128 and 130. In the absence of limiting the capacity of register 38 as in FIG. 1, the overflow accumulator blocks 124 and 126 must be sized with sufficient capacity to prevent system overflow or else number fold-over into the opposite polarity will occur. Flagging by the overflow accumulator can be provided by the carry or borrow output of the last lead ($Q_4$ of 130) going to a high. In FIG. 5, waveforms due to operation of the V/F converter 32 operation is quite similar to that shown in FIG. 3 except that the residue voltage at the output of amplifier 14 is higher because of continuous integration analog input 10 and retention in capacitor 16 of the over-integration charge. The over-integration charge is that charge in capacitor 16 which is in excess of that which allows the output of amplifier 14 to exceed $V_{threshold}$ at the time when $\overline{SB}$ sync signals at 24 produce control signals at 26 or 28 to increment the digital output 46' and apply feedback to intput switch 100 or 106 and 108 to reduce the charge of capacitor 16. In FIG. 4, not only can scale be used to effect the integration time constant, but additionally the value of resistors 104 and 118 as well as $V_{reference}$ 102 and 114 will change the integration time constant.

In summary, FIG. 4 operates with different timing than does FIG. 1 and starts with an analog input such as shown in FIG. 5 and using a scale binary input word of 2. The output will proceed in a negative direction until it exceeds the minus V threshold limit. It will continue increasing and exceeding this limit until the next input pulse on lead 24. At this time it will be discharged in a linear fashion by the closure of switch 106 and the opening of switch 108. The opening of switch 108 is to remove the effect of resistor 110 from the negative input of amplifier 14 during the time that resistor 118 is connected. At the end of the signal on lead 24, capacitor 16 is again charged and the word which is circulating through shift register 38' is a "two." For illustrative purposes, the scale on lead 42 is changed to a digital 4 so that later changes in output are increments of 4 as will be noted from waveform 48 at times 9 and 14. At word time 14, the first overflow occurs from output 50 so as to actuate the block 124 and provide an output on $Q_1$ of leads 128. When the input signal on 10 ceases at the end of word time 21, the output remains in that condition under ideal conditions until a further input signal is obtained.

While it may be obvious to one skilled in the art, it should be noted that the present inventive concept allows a much smaller package for providing an output indicative of a large integral of an input signal than would be required for a completely analog device. The reason for this is that integral capacitor 16 can be much smaller in size and value than the capacitor having the same capacity $Q = CV$ in an analog equivalent. While the following example may be somewhat extreme, a preliminary estimate indicates that an all analog equivalent would require a value of at least 320 cubic inches whereas the apparatus of either FIGS. 1 or 4 may be contained in apparatus considerably smaller than 2 cubic inches. In addition, the cost of large capacity low leakage capacitors is considerable as compared to the same quality capacitors in smaller capacitive values. An additional benefit is that an all analog unit can generate or pass a large amount of noise and this noise is substantially eliminated in the digital implementation of the present invention.

If FIG. 4 were to use a $1\mu f$ capacitance for capacitor 16 and have a $\pm V$ threshold of 1 volt, an accumulator similar to that of FIG. 1 using a clock rate of 500 kHz and a word rate of 31,250 per second might well be used. During each word, an increment could be made in the digital word of the accumulator. If the value of resistors 110 and 118 of FIG. 4 are chosen to remove $Q = CV = 1\mu f \cdot 1 \text{ volt} = 1 \times 10^{-6}$ coulomb, the result will equal 1 LSB in one word time of of 32 microseconds. A total accumulation per second would equal $(31,250)(1 \times 10^{-6})$ coulombs of charge which could be measured and represented by the digital word output of accumulator 34 and the residue charge of capacitor 16. Since the shift register of 16 bits can store 32,767 counts without overflow, the 31,250 counts would be within the capacity of the analog-to-digital integrator without overflow assuming the initial value to be equal to zero. The value of resistors 110 and 113 with the $\pm V$ reference equal 10 volts would be 10 volts/R = I, or in other words, Cdv/dt. With this formula, resistors 110 and 118 plus the resistance of associated switches 106 and 108 would equal 320 ohms.

The equivalent analog integrator would have to store 0.03125 coulombs of charge. Assuming zero initial charge in capacitor 16 and a 10 volt maximum voltage swing allowable, the capacitor would have to be Q/V which equals (0.03125 coulombs/10 volts), or in other words, 3,125 $\mu f$.

Therefore, the digital integrator uses 1/3125 the value of capacitance as compared to the analog equivalent. If $\pm V$ threshold were increased to 10V, the difference would be 1/31,250, but with this change the resistors 110 and 118 would each have to be reduced to 32 ohms.

As may be seen from the above, the effect of the present concept is to multiply the capacitive usability of a capacitor which ordinarily is one of the most bulky components in integrated circuitry. If a D/A converter were added to the output of the accumulator, the same end result as a full analog integrator would be obtained without sacrificing space requirements necessary for the analog integrator capacitor.

While two embodiments of the invention have been shown, both accomplish the same end result. The circuit of FIG. 1 always discharges capacitor 16 to 0. In FIG. 2, a resistor is illustrated in series of switch 18 such that a given quantity of charge reduction is provided. For some applications of the invention, a return to zero charge in capacitor 16 may not be required or desirable and thus the configuration of FIG. 4 is also illustrated. Both configurations are believed to be part of my inventive advance in the art.

While two specific embodiments of the inventive concept have been illustrated and described, it will be obvious to those skilled in the art that other designs may be used to practice the inventive concept. Therefore, I wish to be limited only by the scope of the appended claims.

What is claimed is:

1. Integrator apparatus comprising, in combination:

conversion means, including input means and output means, for providing, at said output means, n outputs/second/volt of analog signal applied to said input means; and digital accumulator means, including control means connected to said output means of said conversion means, signal input means and digital word output means, for algebraically summing digital words with an accumulated digital value in accordance with the polarity of the analog signal upon receipt of signal at said control means and supplying the result at said digital word output means;

said accumulator means including:

storage means for use in circulating the accumulated digital words;

adder means, including overflow means, for summing the circulated digital word with the input word upon receipt of a control signal and providing an output at said overflow means when the capacity of said adder is exceeded; and limiter means connected to said overflow means, for converting the circulated word to a limit word whenever an overflow output signal is generated.

2. Analog-to-digital integration apparatus comprising, in combination:

voltage to frequency conversion means, including analog signal input means and first and second output means, said conversion means providing at said first output means n outputs/second/volt of positive analog signal supplied to said input means and providing at said second output means n outputs/second/volt of negative analog signal supplied to said input means;

adder means, including first and second control means, first and second input means and output means, for providing digital output words indicative of the sum or difference of two digital input words in accordance with signals received respectively by said first and second control means;

means connecting said first output means of said conversion means to said first control means of said adder means;

means connecting said second output means of said conversion means to said second control means of said adder means;

storage means connected between said output means and said first input means of said adder means for accumulating sums and returning the sums to be algebraically added to further inputs at said second input means of said adder means in accordance with control input signals;

means for supplying a digital scale input signal to said second input means of said adder means; and apparatus output means, connected to said first input means of said adder means, for providing a digital output word indicative of the integrated value of analog signals supplied to said analog signal input means.

* * * * *